United States Patent
Hiller et al.

(10) Patent No.: US 11,001,385 B2
(45) Date of Patent: May 11, 2021

(54) ENERGY HARVESTING MICRO AIR VEHICLE

(71) Applicant: The Boeing Company, Chicago, IL (US)

(72) Inventors: Nathan D. Hiller, Irvine, CA (US); Clifford G. Cousins, Cypress, CA (US)

(73) Assignee: The Boeing Company, Chicago, IL (US)

( * ) Notice: Subject to any disclaimer, the term of this patent is extended or adjusted under 35 U.S.C. 154(b) by 390 days.

(21) Appl. No.: 16/022,144

(22) Filed: Jun. 28, 2018

(65) Prior Publication Data

US 2020/0002015 A1   Jan. 2, 2020

(51) Int. Cl.
| | |
|---|---|
| *B64D 27/02* | (2006.01) |
| *B64D 27/24* | (2006.01) |
| *B64C 39/02* | (2006.01) |
| *H01L 35/32* | (2006.01) |
| *H02J 7/00* | (2006.01) |
| *H02J 7/34* | (2006.01) |

(52) U.S. Cl.
CPC ............ *B64D 27/24* (2013.01); *B64C 39/024* (2013.01); *B64C 39/028* (2013.01); *H01L 35/32* (2013.01); *H02J 7/007* (2013.01); *B64C 2201/024* (2013.01); *B64C 2201/042* (2013.01); *B64C 2201/108* (2013.01); *B64C 2201/12* (2013.01); *B64C 2201/141* (2013.01); *H02J 7/345* (2013.01)

(58) Field of Classification Search
None
See application file for complete search history.

(56) References Cited

U.S. PATENT DOCUMENTS

| | | | |
|---|---|---|---|
| 8,167,234 B1* | 5/2012 | Moore | B64C 39/028 244/17.25 |
| 2006/0266404 A1* | 11/2006 | Hiller | H01L 35/00 136/205 |

OTHER PUBLICATIONS

Paralta et al., "Optimization-based design of a heat flux concentrator," Scientific Reports 7, 40591, Jan. 2017, 8 pages. https://www.nature.com/articles/srep40591.pdf.

* cited by examiner

*Primary Examiner* — Richard G Davis
(74) *Attorney, Agent, or Firm* — Yee & Associates, P.C.

(57) ABSTRACT

A method, apparatus, and system for charging an electrical storage system in a vehicle. The vehicle comprises a support frame, a propulsion, an electric storage system, an extendable structure, and a power management unit. The propulsion system, the electrical storage system, and the power management unit are physically coupled to the support frame. The electrical storage system supplies the electrical energy to the propulsion system. The group of thermoelectric modules physically is physically coupled to the extendable structure and generates a current in response to a heat being transferred through the group of modules. The power management unit is electrically coupled to the electrical storage system and the group of thermal thermoelectric modules and controls storing the electrical energy in the electrical storage system using the current from the group of thermoelectric modules and supplying the electrical energy to the propulsion system.

29 Claims, 6 Drawing Sheets

ENERGY HARVESTING MICRO AIR VEHICLE

BACKGROUND INFORMATION

1. Field

The present disclosure relates generally to harvesting waste heat and, in particular, to harvesting waste heat for supplying energy to vehicles and devices. Still more particularly, the present disclosure relates to a method, an apparatus, and a system for supplying energy to a vehicle or device with a charging system that uses heat differentials.

2. Background

Micro aerial vehicles (MAVs) are a class of unmanned aerial vehicles (UAVs). These types of unmanned aerial vehicles can be, for example, 5 centimeters long. These types of vehicles are considered insect sized unmanned aerial vehicles and can operate autonomously.

A cyclocopter is a type of micro aerial vehicle that is small, quiet, and energy efficient. A cyclocopter can be used to place and carry sensors to and from hard to reach areas.

Further, a cyclocopter can operate in locations where human operators cannot perform operations such as inspections. For example, a cyclocopter can fly through cracks in concrete rubble to search for earthquake victims. As another example, a cyclocopter can be used to explore buildings contaminated with radiation. In this situation, the cyclocopter can be used to provide radiation readings. Thus, inspections and other operations can be performed without placing humans in harm's way.

Cyclocopters and other types of micro aerial vehicles, however, have battery limitations that limit the flight time of these vehicles. With their size, battery weight is an issue. For example, a lithium-ion battery weighing one gram can be one third of the weight of the cyclocopter.

More generally, the operating time of electrical devices may be limited due to a lack of recharging facilities. Solar power systems (e.g. photovoltaic systems) have been used to recharge such electrical devices. However, typical solar power systems are heavy, may only be used during daytime, and the power output of solar power systems may be further limited by clouds and/or weather.

Therefore, it would be desirable to have a method and apparatus that take into account at least some of the issues discussed above, as well as other possible issues. For example, it would be desirable to have a method and apparatus that overcome a technical problem with supplying energy to micro aerial vehicles in a manner that overcomes weight issues.

SUMMARY

In one illustrative embodiment, a vehicle comprises a support frame, a propulsion, an electric storage system, an extendable structure, and a power management unit. The propulsion system, the electrical storage system, and the power management unit are physically coupled to the support frame. The propulsion system operates using an electrical energy. The electrical storage system supplies the electrical energy to the propulsion system. The group of thermoelectric modules is physically coupled to the extendable heat transfer structure and generates a current in response to a heat being transferred through the group of modules in which the transfer of the heat is caused by a temperature differential. The power management unit is electrically coupled to the electrical storage system and the group of thermal thermoelectric modules and controls, storing the electrical energy in the electrical storage system, using the current from the group of thermoelectric modules and supplying the electrical energy to the propulsion system.

In another illustrative embodiment, a charging system comprises a group of thermoelectric modules, a power management unit, and extendable structure. The group of thermoelectric modules is configured to generate a current in response to a temperature differential. The power management unit has a power output configured to be connected to a user device and to output a current to the user device. The power management unit is electrically coupled to the group of thermoelectric modules. The extendable structure is physically coupled to the power management unit and the group of thermoelectric modules.

In yet another illustrative embodiment, an unmanned aerial vehicle comprises a support frame, a propulsion system, a telescoping member, a heat concentrator, a malleable heat transfer member, a group of thermoelectric modules, an electrical storage unit, and a power management unit. The propulsion system is powered by an electrical energy. The telescoping member has proximal end and a distal end. The heat concentrator is physically coupled to the distal end and the malleable heat transfer member is physically coupled to the heat concentrator. The group of thermoelectric modules is physically coupled to the telescoping member and generates an electric current when heat is transferred through the group of thermoelectric modules in response to the malleable heat transfer member being in proximity of a heat source and a heat sink such heat is transferred through the group of thermoelectric modules. The electrical storage unit is physically coupled to the support frame, wherein the electrical storage unit supplies the electric energy to operate the propulsion system. The power management unit is physically coupled to the support frame, in which the power management unit is electrically coupled to the electrical storage system and the group of thermoelectric modules, and to controls storing the electrical energy in the electrical storage system using the electrical current from the group of thermoelectric modules and supplying the electrical energy to the propulsion system.

In still another illustrative embodiment, a method of charging a vehicle is disclosed. A distal end of an extendable member is extended towards one of a heat source and a heat sink, such that a temperature differential is present, that causes a heat to be transferred through a group of thermoelectric modules, physically coupled to the extendable member, wherein a proximal end of the extendable member is physically coupled to a support frame for the vehicle. An electrical current is generated from a group of thermoelectric modules in response to the heat being transferred through the group of thermoelectric modules, in which the heat being transferred through the group of thermoelectric modules is caused by a temperature differential. Electrical energy is stored in an electrical storage system using the electrical current generated by the group of thermoelectric modules, wherein the electrical storage system is physically coupled to the support frame and supplies electrical energy to operate the vehicle.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

Figure 1:
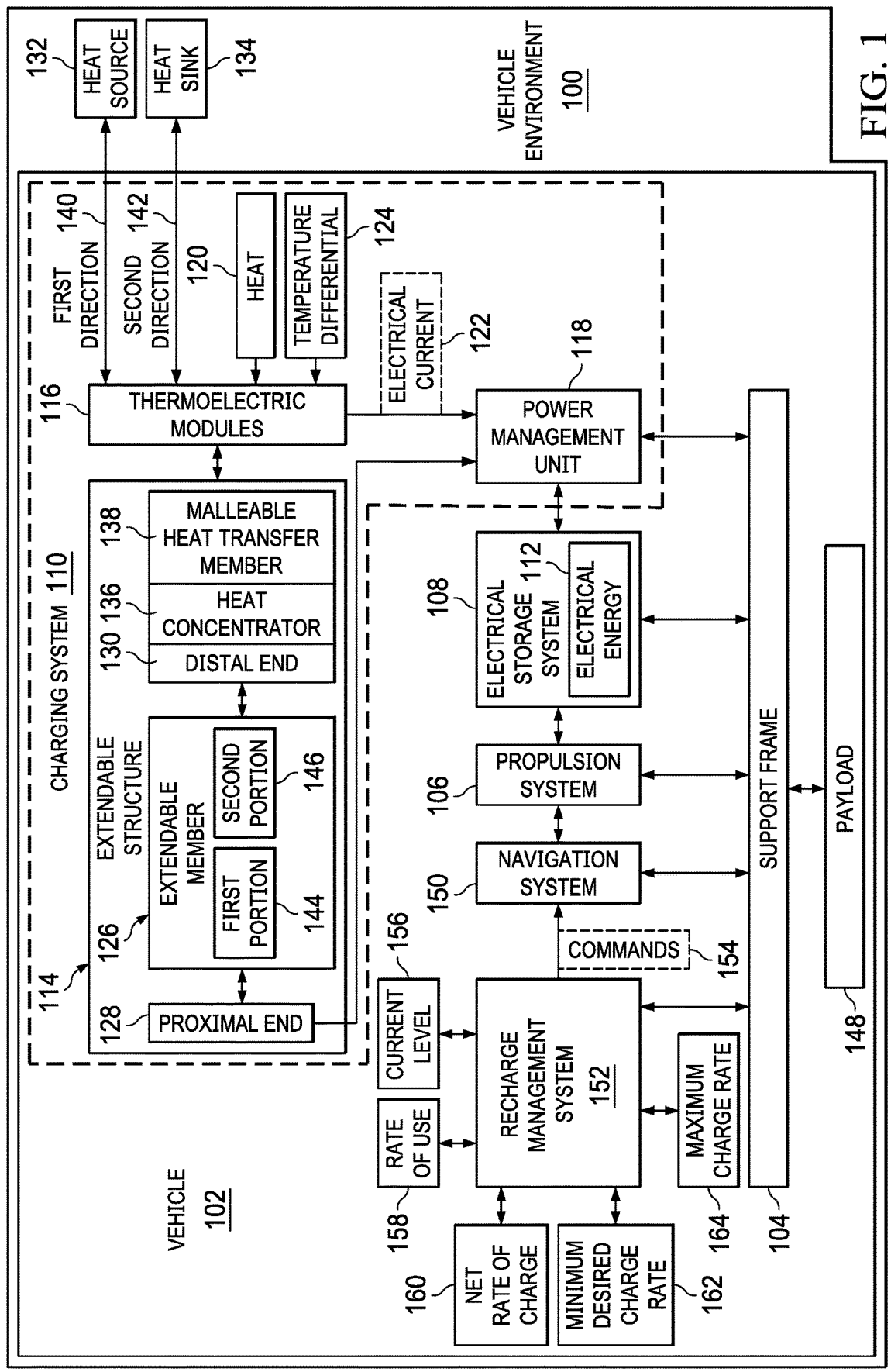
FIG. 1 is an illustration of a block diagram of a vehicle environment in accordance with an illustrative embodiment.

The illustrative embodiments recognize and take into account one or more different considerations. For example, the illustrative embodiments recognize and take into account that energy harvesting systems can be utilized to extend the flight time of unmanned aerial vehicles such as micro aerial vehicles. For example, the illustrative embodiments recognize and take into account that solar cells (e.g. photovoltaic cells) can be used to harvest photonic energy from the sun.

The illustrative embodiments, however, recognize and take into account that using such solar cells on micro aerial vehicles often increases the drag by an undesirable amount. Further, the illustrative embodiments recognize and take into account that solar cells can increase the visibility of the micro aerial vehicle more than desired for use in covert operations. Moreover, the illustrative embodiments recognize and take into account that the use of solar cells that require access to sunlight or light sources, which reduces an ability to operate for a desired amount of time when micro aerial vehicles are utilized indoors, at night, and in cloudy situations.

The illustrative embodiments recognize and take into account that thermal energy harvesting systems may be suitable for use with micro aerial vehicles. The illustrative embodiments recognize and take into account that many sources of thermal energy are present in various environments. Thus, the illustrative embodiments recognize and take into account that using a thermal energy, harvesting system that converts thermal energy into electrical energy can increase the operating time or flight distance of a micro aerial vehicle such as a cyclocopter.

The illustrative embodiments recognize and take into account that covert operations can be performed more easily because the energy harvesting devices can be implemented using systems that are available in small form factors that can be implemented in micro aerial vehicles in a manner that does not increase the visibility of the micro aerial vehicles. For example, the energy harvesting device can take the form of thermoelectric modules that can have a size that is, for example, 1.0 millimeter square.

Further, the illustrative embodiments recognize and take into account that heat sources and sinks, such as waste heat, is abundant. Additionally, the illustrative embodiments recognize and take into account that indoor, nighttime, or low light energy operations can be performed because light is not needed to generate electrical energy.

Thus, the illustrative embodiments provide a method, an apparatus, and a system for a vehicle or other device that can be charged using thermal energy. In one illustrative example, a vehicle comprises a support frame, a propulsion system, an electric storage system, an extendable structure, and a power management unit. The propulsion system, the electrical storage system, and the power management unit are physically coupled to the support frame. The propulsion system operates using electrical energy. The electrical storage system supplies the electrical energy to the propulsion system. The group of thermoelectric modules physically is coupled to the extendable heat transfer structure and generates a current in response to a heat being transferred through the group of modules caused by a temperature differential (e.g. temperature difference or gradient). The power management unit is electrically coupled to the electrical storage system and the group of thermoelectric modules and controls, storing an electrical energy in the electrical storage system using the current from the group of thermoelectric modules, and supplying the electrical energy to the propulsion system.

As used herein, a "group of," when used with reference items, means one or more items. For example, a group of thermoelectric modules is one or more thermoelectric modules.

The illustrative embodiments provide a method, apparatus, and a system for charging devices. In one illustrative example, a charging system comprises a group of thermoelectric modules, a power management unit, and one or more extendable structure. The group of thermoelectric modules is configured to generate a current in response to a temperature differential. The power management unit has a power output (e.g. a power port) configured to be connected to a user device and to output electrical power (e.g. a predetermined current at a predetermined voltage) to the user device. The power management unit is electrically coupled to the group of thermoelectric modules. The extendable structure is physically coupled to the power management unit and to the group of thermoelectric modules.

With reference now to the figures and in particular with reference to FIG. 1, an illustration of a block diagram of a vehicle environment is depicted in accordance with an illustrative embodiment. As depicted, vehicle environment 100 is an environment in which vehicle 102 operates. Vehicle 102 can take a number of different forms. For example, vehicle 102 can be selected from a group comprising a cyclocopter, a micro aerial vehicle, an unmanned aerial vehicle, an unmanned ground vehicle, an unmanned underwater vehicle, and other suitable types of vehicles.

In this illustrative example, vehicle 102 comprises support frame 104, propulsion system 106, electrical storage system 108, and charging system 110. Support frame 104 is a physical structure that supports or holds components for vehicle 102. In this illustrative example, propulsion system 106, electrical storage system 108, and charging system 110 are physically coupled to support frame 104.

In the illustrative examples, a first component, propulsion system 106, "coupled to" a second component, support frame 104, means that the first component can be coupled directly or indirectly to the second component. In other words, additional components may be present between the first component and the second component. The first component is considered to be indirectly coupled to the second component when one or more additional components are present between the two components. When the first component is directly coupled to the second component, no additional components are present between the two components Further, in this illustrative example, propulsion system 106 operates using electrical energy 112. Propulsion system 106 moves vehicle 102 within vehicle environment 100.

As depicted, electrical storage system 108 supplies electrical energy 112 to propulsion system 106. Electrical storage system 108 can also supply electrical energy 112 to other components in vehicle 102 or attached to the vehicle. As depicted, electrical storage system 108 comprises at least one of a battery, a lithium ion battery, a capacitor, an electrical accumulator, or some other suitable type of device that is capable of storing and providing electrical energy 112.

In this illustrative example, charging system 110 operates to charge electrical storage system 108 by storing electrical energy 112 in electrical storage system 108. As depicted, charging system 110 comprises extendable structure 114, a group of thermoelectric modules 116, and power management unit 118. Balance of the flying vehicle is important. A counter-acting, movable structure (not shown) may be used to counter-act any rotational imbalance introduced by the extension of extendable structure 114. For example, the counter-acting movable structure may be an added weight or a portion of the flying vehicle that may be simultaneously moved or dislocated in a direction opposite of the movement of extendable structure 114 to maintain the fore-aft center of gravity while extendable structure 114 is extended.

The group of thermoelectric modules 116 operate to convert heat 120 into electrical power (e.g. electrical current 122 at a predetermined voltage). For example, the group of thermoelectric modules 116 generates electrical current 122 in response to heat 120 being transferred through the group of thermoelectric modules 116.

The transfer of heat 120 through the group of thermoelectric modules 116 is caused by temperature differential 124. In this illustrative example, a thermoelectric module in the group of thermoelectric modules 116 can be a circuit containing thermoelectric materials, which generate electrical current 122 directly from heat 120.

In this example, the thermoelectric module includes two dissimilar thermoelectric materials joined at their ends. For example, an n type semiconductor can be joined to a p type semiconductor. The magnitude of electrical current 122 can be directly proportional to the size of temperature differential 124 and/or the number of thermoelectric modules. The group of thermoelectric modules 116 operates using at least one of a Seebeck effect, a Peltier effect, or a Thomson effect as known to a person of skill in the relevant art. In the illustrative examples, the group of thermoelectric modules 116 can be implemented using micro thermoelectric modules or any other type of thermoelectric modules that have at least one of a desired weight, dimensions, or power characteristics.

As depicted, power management unit 118 is electrically coupled to electrical storage system 108 and a group of thermoelectric modules 116. Power management unit 118 controls storing electrical energy 112 in electrical storage system 108 using electrical current 122 from the group of thermoelectric modules 116. Power management unit 118 supplies electrical energy 112 stored in electrical storage system 108 to propulsion system 106 as well as to other components in vehicle 102.

As depicted, extendable structure 114 can take a number of different forms. For example, extendable structure 114 may comprise extendable member 126 having proximal end 128 and distal end 130. In other illustrative examples, extendable structure 114 comprises one of a telescoping member, a telescopic cylinder, a screw-drive boom, and a folding beam in addition to or in place of extendable member 126.

Proximal end 128 is physically coupled to power management unit 118. In this example, distal end 130 is positionable to one of heat source 132 and heat sink 134 such that temperature differential 124 is present causing heat 120 to be transferred through the group of thermoelectric modules 116. In response to the transfer of heat 120, electrical current 122 is generated by the group of thermoelectric modules 116.

For example, distal end 130 of extendable member 126 can be extended towards one of heat source 132 and heat sink 134 such that heat 120 is transferred through the group of thermoelectric modules 116. In the illustrative examples, distal end 130 does need to contact heat source 132 or heat sink 134 to cause the group of thermoelectric modules 116 to generate electrical current 122. Distal end 130 only needs to be close enough to one of heat source 132 and heat sink 134 such that heat 120 transfers through the group of thermoelectric modules 116 sufficiently to generate electrical current 122.

According to one embodiment, extendable structure 114 also may comprise heat concentrator 136 and malleable heat transfer member (e.g. heat transfer pad) 138. In this illustrative example, heat concentrator 136 is physically coupled to distal end 130. Heat concentrator 136 planar member is comprised of a material that concentrates or focuses heat 120 from heat source 132. For example, heat concentrator 136 can be comprised of material selected from at least one diamond, carbon nanotubes, a metamaterial, a thermally conductive metal such as nickel steel, or other suitable materials. In this example, heat concentrator 136 can have a thickness from about 0.03125 inches to about 0.125 inches and a diameter from about 0.25 inches to about 2.0 inches Malleable heat transfer member 138, such as a malleable heat transfer pad, has the properties of positive engagement with and conformability to a surface and is physically coupled to heat concentrator 136. In this manner, waste heat is efficiently transferred to heat concentrator 136. Malleable heat transfer member 138 has a coefficient of friction sufficient to reduce sliding of malleable heat transfer member 138 when malleable heat transfer member 138 is in contact with a surface of one of heat source 132 and heat sink 134.

Malleable heat transfer member 138 comprises a number of different types of materials. For example, malleable heat transfer member 138 can be comprised of silicone combined with a thermal medium such as ceramic. In one illustrative example, silicone and ceramic powders can be mixed, cast, and cured to form a member, such as a pad, that is malleable and conducts heat. In this illustrative example, malleable heat transfer member 138 can be from about 0.020 inches to about 0.250 inches thick and have a diameter from about 0.25 inches to about 2.0 inches. The thermal performance can be from about 1.0 Watt/meter-Kelvin (W/m-K) to about 3.0 W/m-K. Moreover, in some illustrative examples, heat concentrator 136 is configured to pivot about distal end 130. By pivoting heat concentrator 136 (with malleable heat transfer member 138,) this allows extendable structure 114 to engage at an angle with the surface of heat source 132. In this manner, some portion of the weight of vehicle 102 disposed above the engagement location may be borne by the frictional engagement of malleable heat transfer member 138 with heat source 132. The pivoting of heat concentrator 136 may be implemented as a gimbal to mate a planar member with a shaft where the planar member pivots in any direction to allow engagement with an irregular heat source surface.

In one illustrative example, the one or more (e.g. group of) thermoelectric modules 116 is located at proximal end 128 adjacent to power management unit 118. Extendable member 126 conducts heat 120 in a direction selected from first direction 140 from heat source 132 to the group of thermoelectric modules 116 and second direction 142 from the group of thermoelectric modules 116 to heat sink 134.

In another example, the group of thermoelectric modules 116 is located at distal end 130 of extendable member 126. In this illustrative example, extendable member 126 conducts electrical current 122 from the group of thermoelectric modules 116 to power management unit 118.

In still another illustrative example, the group of thermoelectric modules 116 is located between distal end 130 and proximal end 128 of extendable member 126. First portion 144 of extendable member 126 from distal end 130 to the group of thermoelectric modules 116 conducts heat 120, and second portion 146 of extendable member 126 from the group of thermoelectric modules 116 to proximal end 128 conducts electrical current 122 generated by the group of thermoelectric modules 116.

As depicted, power management unit 118 is configured to control extendable structure 114. For example, power management unit 118 controls a length of extendable member 126 in extendable structure 114.

In this illustrative example, vehicle 102 also may include payload 148. When present, payload 148 is physically coupled to support frame 104 and electrically coupled electrical storage system 108. Electrical storage system 108 provides electrical energy 112 to payload 148. Payload 148 can comprise at least one of a wireless transmitter, a wireless receiver, a sensor, or some other suitable device.

As used herein, the phrase "at least one of" when used with a list of items, means different combinations of one or more of the listed items that may be used, and only one of each item in the list may be needed. In other words, "at least one of" means any combination of items and number of items may be used from the list, but not all of the items in the list are required. The item may be a particular object, a thing, or a category.

For example, without limitation, "at least one of item A, item B, or item C" may include item A, item A and item B, or item C. This example also may include item A, item B, and item C or item B and item C. Of course, any combinations of these items may be present. In some illustrative examples, "at least one of" may be, for example, without limitation, two of item A; one of item B; and ten of item C; four of item B and seven of item C; or other suitable combinations.

Vehicle 102 can also include other components. As depicted, vehicle 102 can also include navigation system 150 and recharge management system 152. These systems can be physically connected to support frame 104.

In this illustrative example, navigation system 150 is configured to control propulsion system 106 to move vehicle 102 in response to receiving commands 154. In this example, commands 154 can be received from recharge management system 152.

As depicted, recharge management system 152 is in communication with navigation system 150 and the group of thermoelectric modules 116. Recharge management system 152 is configured to detect electrical current 122 of current level 156 from the group of thermoelectric modules 116 and detect rate of use 158 of electrical energy 112 stored in electrical storage system 108.

Recharge management system 152 is also configured to determine net rate of charge 160 of electrical storage system 108 using electrical current 122 with current level 156 detected from the group of thermoelectric modules 116 and rate of use 158. Further, recharge management system 152 is configured to compare net rate of charge 160 of energy charge with minimum desired charge rate 162 and maximum charge rate 164.

As depicted, recharge management system 152 sends commands 154 to navigation system 150. In the illustrative example, commands 154 can be a seek command when net rate of charge 160 is below minimum desired charge rate 162. Commands 154 can be a stay command when net rate of charge 160 is equal to or above minimum desired charge rate 162. In another example, commands 154 can be a positioning (e.g. re-positioning) command that causes vehicle 102 to move relative to one of heat source 132 and heat sink 134 to increase net rate of charge 160 when net rate of charge 160 is above minimum desired charge rate 162 and below maximum charge rate 164 in order to increase the net rate of charge without seeking a new waste heat source.

In this illustrative example, navigation system 150 can include a thermal sensing unit. The thermal sensing unit is configured to detect at least one of heat source 132 or heat sink 134. With the thermal sensing unit, navigation system 150 can control propulsion system 106 to move vehicle 102 such that distal end 130 of extendable member 126 moves in a dithering pattern or other pattern to find one of a hot region or a cold region.

Figure 2:
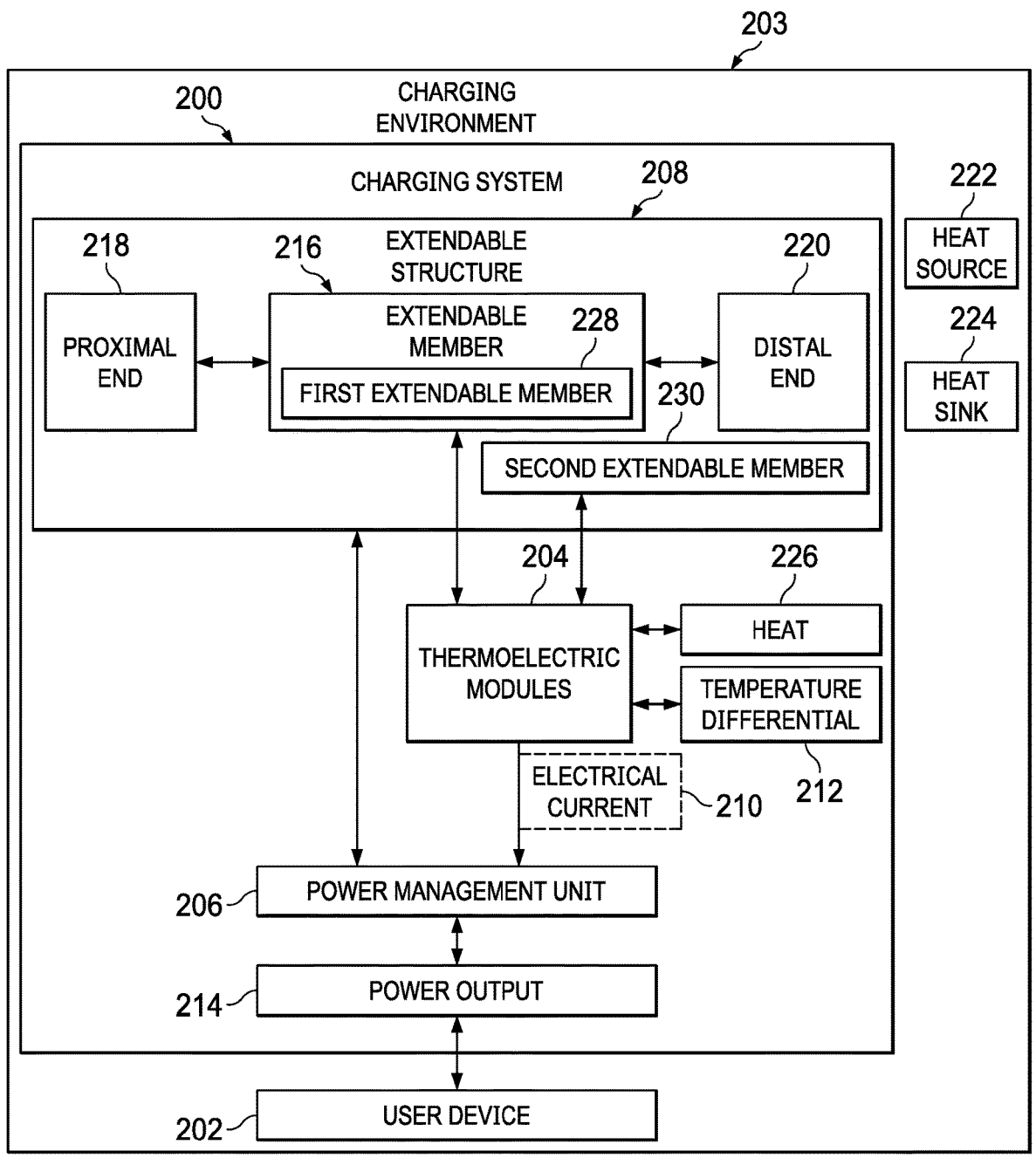
FIG. 2 is an illustration of a block diagram of a charging environment for charging a user device in accordance with in illustrative embodiment.

Turning next to FIG. 2, an illustration of a block diagram of a charging environment for charging a user device is depicted in accordance with an illustrative embodiment. In this illustrative example, charging system 200 operates to charge user device 202 in charging environment 203.

User device 202 can take a number of different forms. For example, in a wilderness area, user device 202 can be selected from a group comprising a light (e.g. light emitting diode flashlight or lantern), a mobile phone, a satellite phone, a walkie-talkie, a radio, a global positioning system (GPS), and other suitable types of devices.

In this illustrative example, charging system 200 includes a number of different components. As depicted, charging system 200 comprises a group of thermoelectric modules 204, power management unit 206, and extendable structure 208.

The group of thermoelectric modules 204 is configured to generate electrical current 210. In this example, electrical current 210 is generated in response to temperature differential 212.

In this illustrative example, power management unit 206 is electrically coupled to the group of thermoelectric modules 204. Power management unit 206 has power output 214 configured to be connected to user device 202. Power output 214 is configured to output electrical current 210 to user device 202.

Extendable structure 208 is physically coupled to power management unit 206 and the group of thermoelectric modules 204. In a similar fashion to extendable structure 114 in FIG. 1, extendable structure 208 comprises extendable member 216, which has proximal end 218 and distal end 220. Proximal end 218 is physically coupled to power management unit 206 and distal end 220 is positionable to one of heat source 222 and heat sink 224 such that temperature differential 212 is present and causes heat 226 to be transferred through the group of thermoelectric modules 204 to generate electrical current 210.

The placement of the group of thermoelectric modules 204 on extendable member 216 may be in locations similar to the placement of the group of thermoelectric modules 116 on extendable member 126 in FIG. 1.

Additionally, extendable member 216 can be first extendable member 228 and the group of thermoelectric modules 204 can be a first group of thermoelectric modules 204. Extendable structure 208 can further include a second group of thermoelectric modules 204 and second extendable member 230. In this example, second extendable member 230 can be physically coupled to power management unit 206 and to the second group of thermoelectric modules 204.

As depicted, first extendable member 228 and second extendable member 230 can be placed into contact with or in proximity of heat source 222 or heat sink 224. For example, first extendable member 228 and second extendable member 230 can be placed in contact with heat source 222. In another illustrative example, first extendable member 228 is placed into contact with heat source 222 while second extendable member 230 is placed into contact with heat sink 224.

In the illustrative examples, power management unit 118, navigation system 150, recharge management system 152 in FIG. 1, and power management unit 206 may be implemented in software, hardware, firmware or a combination thereof. When software is used, the operations performed by one or more of these components may be implemented in program code configured to run on hardware, such as a processor unit. When firmware is used, the operations performed by one or more of these components may be implemented in program code and data and stored in persistent memory to run on a processor unit. When hardware is employed, the hardware may include circuits that operate to perform the operations in one or more of these components.

In the illustrative examples, the hardware may take a form selected from at least one of a circuit system, an integrated circuit, an application specific integrated circuit (ASIC), a programmable logic device, or some other suitable type of hardware configured to perform a number of operations. With a programmable logic device, the device may be configured to perform the number of operations. The device may be reconfigured at a later time or may be permanently configured to perform the number of operations. Programmable logic devices include, for example, a programmable logic array, a programmable array logic, a field programmable logic array, a field programmable gate array, and other suitable hardware devices. Additionally, the processes may be implemented in organic components integrated with inorganic components and may be comprised entirely of organic components excluding a human being. For example, the processes may be implemented as circuits in organic semiconductors.

In one illustrative example, one or more technical solutions are present that overcome a technical problem with supplying energy to micro aerial vehicles in a manner that overcomes weight issues. As a result, one or more technical solutions may provide a technical effect of supplying energy by charging an electrical storage system using a charging system that creates an electric current using temperature differentials. In one or more technical solutions, the temperature differentials can be caused by extending an extendable structure towards one of a heat source and a heat sink such that heat is transferred through one or more thermoelectric modules such that a current is generated and sent to the electrical storage system to be stored as electrical energy.

The illustrations of vehicle environment 100 in FIG. 1 and charging environment 203 in FIG. 2 are not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, extendable structure 114 in FIG. 1 can also have a second extendable member in addition to extendable member 126. In another illustrative example, one or more additional extendable members may be present in addition to first extendable member 228 and second extendable member 230 in FIG. 2.

In other illustrative examples, distal end 130 of extendable member 126 does not have to be in direct contact with either heat source 132 or heat sink 134. Instead, distal end 130 may be in proximity of one of heat source 132 and heat sink 134 such that temperature differential 124 occurs, resulting in a transfer of heat through the group of thermoelectric modules 116 that generates electrical current 122.

As another example, extendable member 126 in FIG. 1 or extendable member 216 in FIG. 2 are thermally conductive or a portion of these extendable members are thermally conductive. Thermal conductivity can be achieved in a number of different ways. For example, the extendable members themselves can be constructed of thermal conductive materials. These materials can be selected from at least one of silver, copper, aluminum, carbon nanotubes, diamond, or other suitable types of materials. As another example, these extendable members can incorporate elements that provide thermal connectivity to the extendable members.

For example, extendable member 126 and extendable member 216 can incorporate micro heat pipes. A micro heat pipe is a heat transfer device that combines both the principle of thermal conductivity and phase transition to transfer heat between two solid interfaces.

Figure 3:
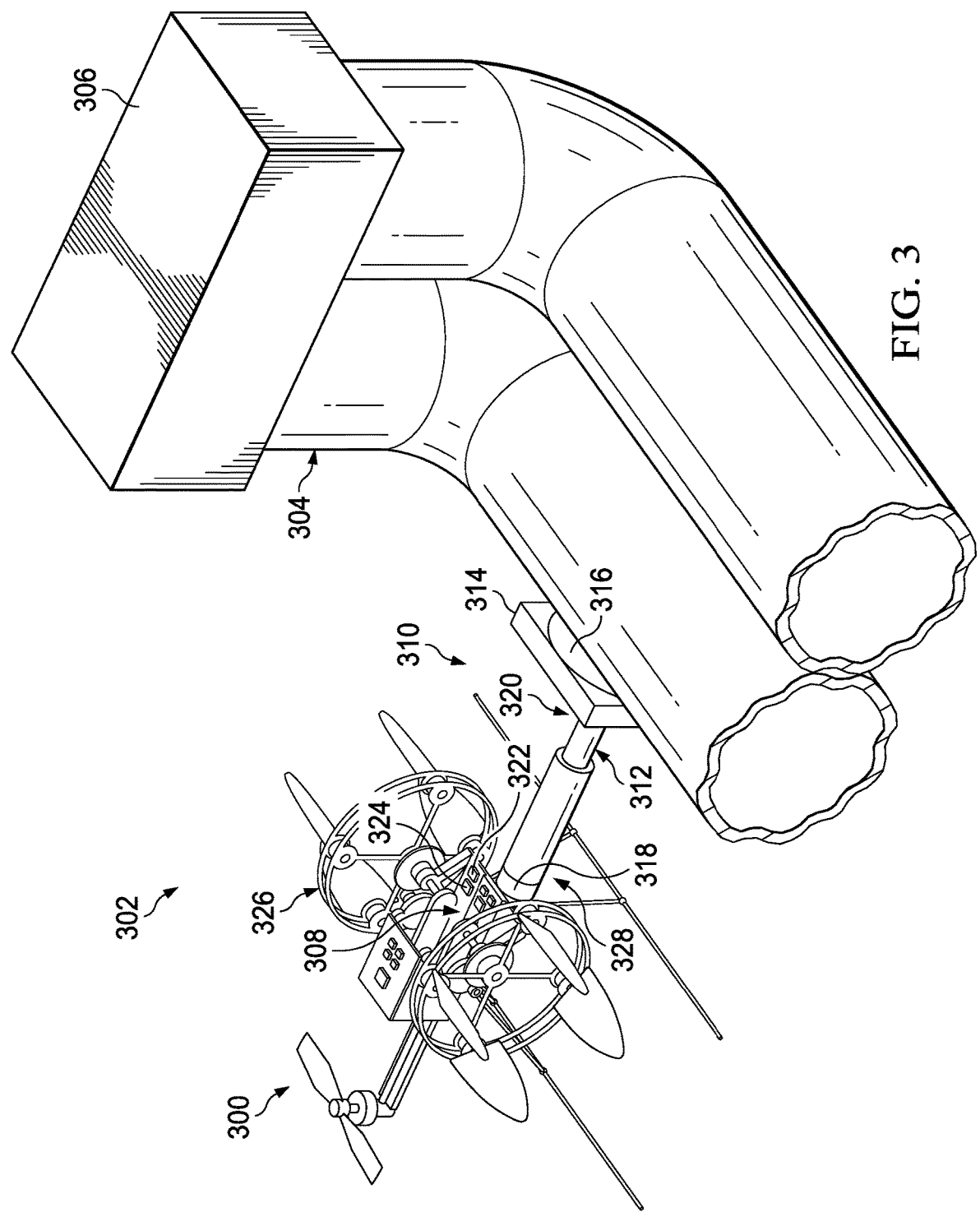
FIG. 3 is an illustration of a micro aerial vehicle charging environment in accordance with an illustrative embodiment.

With reference now to FIG. 3, an illustration of a micro aerial vehicle charging environment is depicted in accordance with an illustrative embodiment. In this illustrative example, cyclocopter 300 is an example of a micro aerial vehicle operating in micro aerial vehicle environment 302. Cyclocopter 300 is an example of an implementation for vehicle 102 shown in block form in FIG. 1.

As depicted, cyclocopter 300 can use thermal energy from various sources to extend its operating time. For example, cyclocopter 300 uses waste heat from a heat source such as heated pipes 304 to recharge its batteries. In other words, heated pipes 304 is heat source 306 that can be used to generate electrical current in charging system 308.

Charging system 308 is an example of an implementation of charging system 110 shown in block form in FIG. 1. In this depicted example, extendable structure 310 is extended towards heated pipes 304.

In this illustrative example, extendable structure 310 comprises telescoping member 312, heat concentrator 314, and malleable heat transfer member (e.g. heat transfer pad) 316. Heat concentrator 314 and malleable heat transfer member 316 are located at distal end 320 of telescoping member 312.

As depicted, malleable heat transfer member 316 can have an angle with respect to the surface of heated pipes 304. The angle may aid in supporting cyclocopter 300. As a result, malleable heat transfer member 316 contacting one of the heat source and the heat sink reduces an amount of lift needed by cyclocopter 300 such that a use of electrical energy from the batteries in the electrical storage system for cyclocopter 300 is reduced. As a result, cyclocopter 300 uses less electrical energy while charging electrical storage element (e.g. rechargeable battery) 324. Telescoping member 312 is an example of one implementation of extendable member 126 shown in block form in FIG. 1.

In this example, thermoelectric modules 318 are located at proximal end 328 of telescoping member 312. With this configuration, telescoping member 312 is constructed to be thermally conductive and includes a thermally conductive material.

For example, telescoping member 312 can be comprised of at least one of silver, copper, aluminum, carbon nanotubes, diamond, or other suitable types of materials. As another example, telescoping member 312 can incorporate micro heat pipes.

In this illustrative example, thermoelectric modules 318 generate electrical current that is sent to power management unit 322 to charge electrical storage element 324. Additionally, power management unit 322 supplies power to operate propulsion system 326.

The illustration of micro aerial vehicle environment 302 in FIG. 3 is provided as an example of a charging system in a vehicle and is not meant to limit the manner in which other illustrative examples can be implemented. For example, other types of micro aerial vehicles can be used in addition to or in place of cyclocopter 300. For example, a DelFly II can incorporate charging system 308. A DelFly II is a wing flapping micro aerial vehicle having a wingspan of about 28 centimeters and weighing about 16 grams.

In other illustrative examples, heat source 306 may take forms other than heated pipes 304. For example, heat source 306 can be selected from a group comprising an aircraft engine, a truck exhaust pipe, a car hood, a stove, a power transformer, an uninsulated section of a pressurized steam pipe, sun-heated surfaces, or other suitable types of heat sources that can generate waste heat. Further, charging system 308 can also be used to generate electricity from a heat sink in addition to or in place of heat source 306. For example, the heat sink can be cold pipes in a liquid natural gas regasification terminal.

Figure 4:
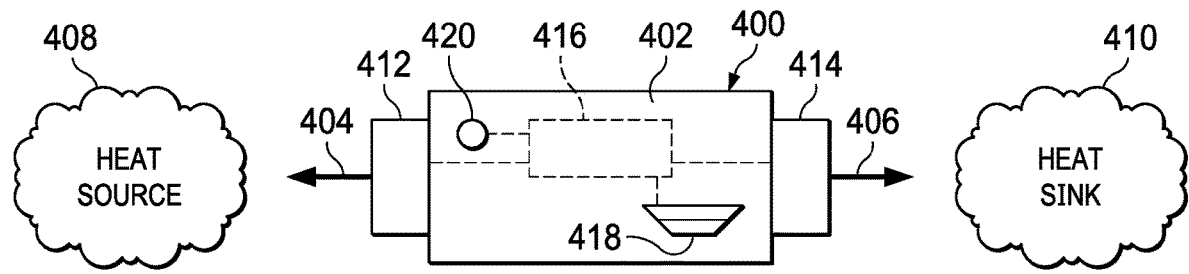
FIG. 4 is an illustration of a charging system for user devices in accordance with an illustrative embodiment.

With reference next to FIG. 4, an illustration of a charging system for user devices is depicted in accordance with an illustrative embodiment. In this illustrative example, charging system is an example of an implementation of charging system 200 shown in block form in FIG. 2.

In this illustrative example, charging system 400 comprises housing 402. As depicted, first extendable member 404 and second extendable member 406 are connected to housing 402. As depicted, these extended members are in a retracted position with respect to heat source 408 and heat sink 410.

In this illustrative example, first extendable member 404 and second extendable member 406 are comprised of a thermally conductive material or incorporate thermally conductive elements that conduct heat to or from first thermoelectric module 412 and second thermoelectric module 414. These thermoelectric modules generate an electric current, which is transferred through the thermoelectric modules.

As depicted, these thermoelectric modules are electrically coupled to power management unit 416 shown in phantom within housing 402. The electrical current can output at power output 418, which is electrically connected to power management unit 416. In this illustrative example, power output 418 can take a number of different forms. Power output 418 can be selected from one of a universal serial bus (USB) connector; an alternating current power socket, a direct current power socket, a coaxial connector, a barrel connector, or some other suitable type connector that can be connected to user device 202 to charge the user device through power output 418.

In this illustrative example, indicator 420 is electrically connected to power management unit 416. Indicator 420 is configured to indicate the state of charging for a user device. For example, indicator 420 can be a light-emitting diode. Indicator 420 can be red when charging is not occurring, green to indicate charging, flashing green to indicate marginal charge of a user device. A power switch (not shown) is used to switch off charging system 400 when not in use.

Figure 5:
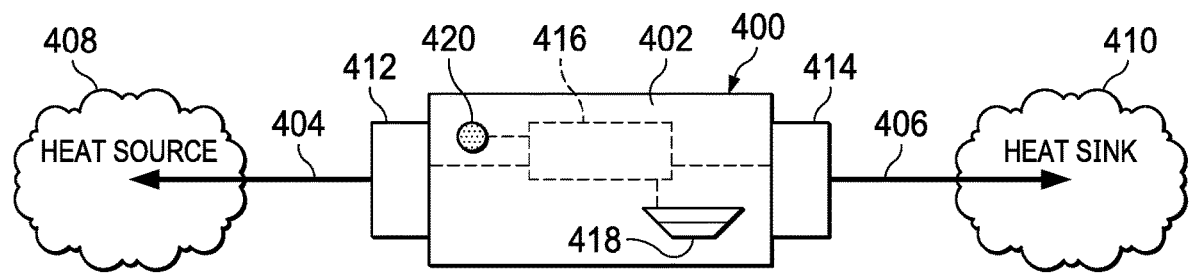
FIG. 5 is an illustration of a charging system for user devices in an extended state in accordance with an illustrative embodiment.

Turning now to FIG. 5, an illustration of a charging system for user devices in an extended state is depicted in accordance with an illustrative embodiment. As this example, first extendable member 404 and second extendable member 406 are in an extended state. As depicted, first extendable member 404 is extended to heat source 408, and second extendable member 406 is extended to heat sink 410.

In this illustrative example, heat from heat source 408 is conducted along first extendable member 404 to and transferred through first thermoelectric module 412 such that first thermoelectric module 412 generates an electric current. Heat is conducted through second thermoelectric module 414 and along second extendable member 406 toward heat sink 410 in a manner that causes second thermoelectric module 414 to generate an electric current. Because heat is conducted through first extendable member 404 and second extendable member 406, there may be a delay before power is generated based on the temperature differences.

Figure 6:
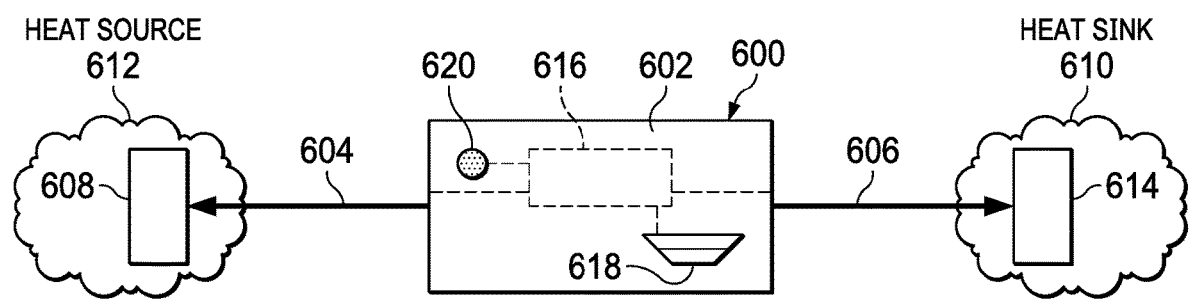
FIG. 6 is an illustration of a charging system in accordance with an illustrative embodiment.

With reference next to FIG. 6, illustration of a charging system is depicted in accordance with an illustrative embodiment. In this illustrative example, charging system 600 includes housing 602. First extendable member 604 and second extendable member 606 are physically connected to housing 602. These extendable members are shown in an extended position.

First thermoelectric module 608 is physically connected to the distal end of the first extendable member 604. Second thermoelectric module 614 is physically connected to the distal end of second extendable member 606.

In this illustrative example, first thermoelectric module 608 is extended onto or near heat source 612. Heat source 612 may provide a heat gradient across at least a portion of first thermoelectric module 608 such that first thermoelectric module 608 generates electrical power. The extension of first thermoelectric module 608 is such that heat is transferred through first thermoelectric module 608 in a manner that generates an electric current. Second thermoelectric module 614 is extended onto heat sink 610. In a similar fashion, second thermoelectric module 614 also generates an electric current when heat is transferred through second thermoelectric module 614 towards heat sink 610.

As depicted, first extendable member 604 is electrically connected to first thermoelectric module 608 and power management unit 616, shown within housing 602. Second extendable member 606 is electrically connected to second thermoelectric module 614 and power management unit 616. In this manner electrical current flows to power management unit 616 and to power output 618 in order to charge user device 202, as described above. Because electrical current is conducted through first extendable member 604 and second extendable member 606 there may be less of a delay before power is generated based on the temperature differences when compared with the embodiment illustrated in FIG. 5. In this example, charging system 600 also includes indicator 620 which is configured to indicate a state of charging for charging system 600. A power switch (not shown) is used to switch off charging system 600 when not in use.

Figure 7:
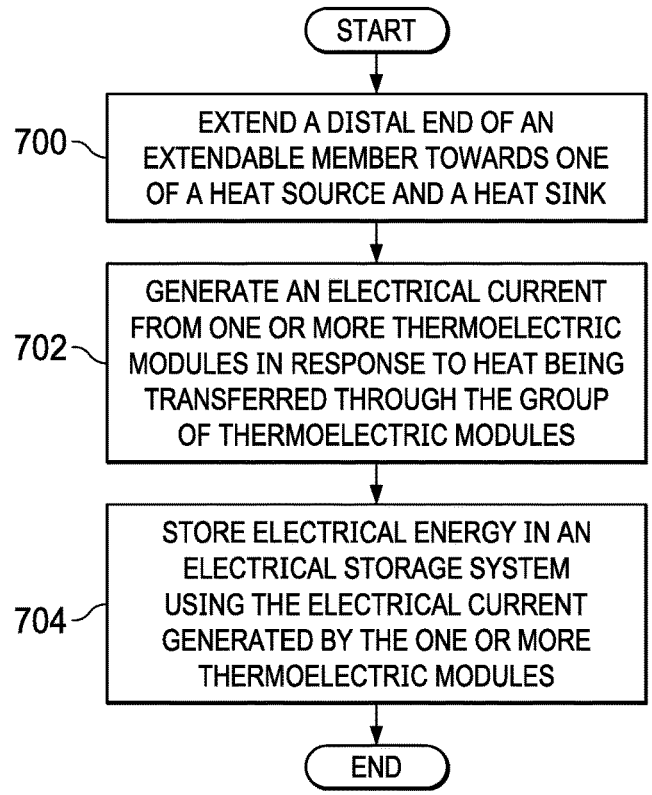
FIG. 7 is a flowchart of a process for charging an unmanned aerial vehicle in accordance with an illustrative embodiment.

Turning next to FIG. 7, a flowchart of a process for charging an unmanned aerial vehicle is depicted in accordance with an illustrative embodiment. The process illustrated in FIG. 7 can be implemented in vehicles such as vehicle 102 in FIG. 1 and cyclocopter 300 in FIG. 3.

The process begins by extending a distal end of an extendable member towards one of a heat source and a heat sink (operation 700). The extension of the extendable member is such that a temperature differential is present that causes a heat to be transferred through a group of thermoelectric modules physically coupled to the extendable member. The proximal end of the extendable member it physically coupled to a support frame for the unmanned aerial vehicle.

Further, a heat concentrator can be physically coupled to the distal end with a malleable heat transfer member physically coupled to the heat concentrator. The mountable heat transfer member contacts one of the heat source and the heat sink such that the temperature differential is present in a manner that causes the heat to transfer through the group of thermoelectric modules.

The process generates an electrical current from one or more (e.g. a group of) thermoelectric modules in response to heat being transferred through the group of thermoelectric modules (operation 702). In operation 702, the heat transferred through the group of thermoelectric modules is caused by a temperature differential on each side of the thermoelectric modules.

The process stores electrical energy in an electrical storage system using the electrical current generated by the one or more thermoelectric modules (operation 704). The process terminates thereafter. The electrical storage system is physically coupled to the support frame and supplies electrical energy to operate the unmanned aerial vehicle.

Figure 8:
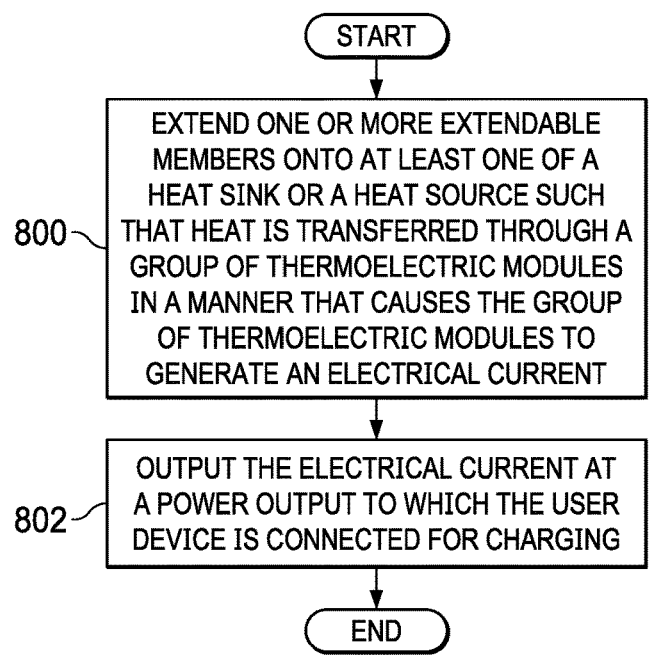
FIG. 8 is an illustration of a flowchart of a process for charging a user device in accordance with an illustrative embodiment.

With reference next to FIG. 8, an illustration of a flowchart of process for charging a user device is depicted. In accordance with an illustrative embodiment, the process illustrated in FIG. 8 can be implemented using charging system 200 to charge user device 202 in FIG. 2.

The process begins by extending one or more extendable members onto at least one of a heat sink or a heat source such that heat is transferred through a group of thermoelectric modules in a manner that causes the group of thermoelectric modules to generate an electrical current (operation 800).

The process outputs the electrical current at a power output (418, 618) to which the user device 202 is connected for charging (operation 802). The process terminates thereafter.

Figure 9:
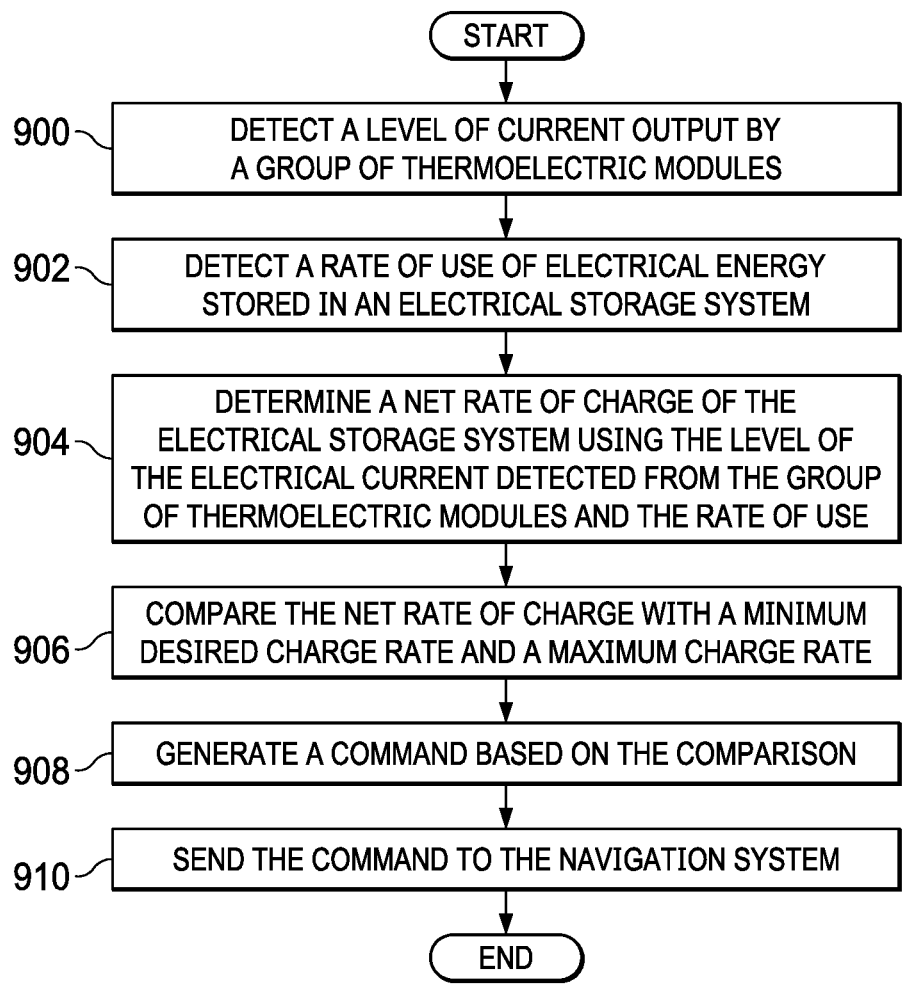
FIG. 9 is an illustration of a flowchart of a process for managing charging of a vehicle in accordance with an illustrative embodiment.

With reference now to FIG. 9, an illustration of a flowchart of a process for managing charging of a vehicle is depicted in accordance with an illustrative embodiment. The process illustrated in FIG. 9 can be implemented in vehicle 102 in FIG. 1 and cyclocopter 300 in FIG. 3. For example, the process can be implemented using navigation system 150 and recharge management system 152 shown in block form in FIG. 1.

The process begins by detecting a level of current output by a group of thermoelectric modules (operation 900). The process detects a rate of use of electrical energy stored in an electrical storage system (operation 902).

The process determines a net rate of charge of the electrical storage system using the level of the electrical current detected from the group of thermoelectric modules and the rate of use (operation 904). The net rate of charge is compared with a minimum desired charge rate and a maximum charge rate (operation 906). The process generates a command based on the comparison (operation 908). The command generated in operation 908 can take a number of different forms. For example, the command can be a seek command when the net rate of charge is below the minimum desired charge rate. The seek command causes the vehicle to move to find another heat source or heat sink. Alternatively, the seek command may be asserted as an indication to a user that the current power generated is inadequate.

In another example, the command is a stay command when the net rate of charge equal to or above the minimum desired charge rate. This command causes the vehicle to remain in the current position for charging the electrical storage system. The command can be a positioning command that causes the vehicle to move relative to the heat source to increase the net rate of charge when the net rate of charge is above the minimum desired charge rate and below a maximum charge rate. A variation of the stay command is a rest command where vehicle 102 may rest such as on a shelf or other location adjacent to or on top of the waste heat source where propulsion system 106 is not active in order to more rapidly charge.

These commands are only examples of some commands that can be generated. Other commands can also be used in addition to or in place of the ones described. For example, the command can be sent to the power management unit to change the way or extension of an extendable structure based on comparison. The process sends the command to the navigation system (operation 910). Alternatively, the stay (or rest) command may be asserted as an indication to a user that the current power generated is adequate. The process terminates thereafter.

The flowcharts and block diagrams in the different depicted embodiments illustrate the architecture, functionality, and operation of some possible implementations of apparatuses and methods in an illustrative embodiment. In this regard, each block in the flowcharts or block diagrams can represent at least one of a module, a segment, a function, or a portion of an operation or step. For example, one or more of the blocks can be implemented as program code, hardware, or a combination of the program code and hardware. When implemented in hardware, the hardware may, for example, take the form of integrated circuits that are manufactured or configured to perform one or more operations in the flowcharts or block diagrams. When implemented as a combination of program code and hardware, the implementation may take the form of firmware. Each block in the flowcharts or the block diagrams may be implemented using special purpose hardware systems that perform the different operations or combinations of special purpose hardware and program code run by the special purpose hardware.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

Thus, the illustrative examples provide a method, apparatus, and system for charging devices such as electrical storage systems in vehicles or electrical storage systems and user devices. One or more of the illustrative examples provide a technical solution that has a technical effect of extending battery life for electrical storage systems. One or more technical solutions are present that overcome a technical problem with supplying energy to micro aerial vehicles in a manner that overcomes weight issues.

The illustrative examples employ the charging system that can charge an electrical storage system using a heat source or heat sink. For example, one or more illustrative examples can convert waste heat into an electrical current using a group of thermoelectric modules. The electric current generated by a group of thermoelectric modules is stored as electrical energy.

For example, one or more technical solutions may provide a technical effect supplying energy by charging an electrical storage system using a charging system that creates an electric current using temperature differentials. In one or more technical solutions, the temperature differentials can be caused by extending an extendable structure towards one of a heat source and a heat sink such that heat is transferred through one or more thermoelectric modules, such that a current is generated and sent to the electrical storage system to be stored as electrical energy.

The description of the different illustrative embodiments has been presented for purposes of illustration and description and is not intended to be exhaustive or limited to the embodiments in the form disclosed. The different illustrative examples describe components that perform actions or operations. In an illustrative embodiment, a component may be configured to perform the action or operation described. For example, the component may have a configuration or design for a structure that provides the component an ability to perform the action or operation that is described in the illustrative examples as being performed by the component.

Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A vehicle that comprises:
a support frame;
a propulsion system physically coupled to the support frame and configured to operate with an electrical energy;
an electrical storage system physically coupled to the support frame and configured to supply the electrical energy to the propulsion system,
an extendable structure;
a group of thermoelectric modules physically coupled to the extendable structure and configured to generate an electrical current in response to a temperature differential that causes a heat being transferred through the group of thermoelectric modules; and
a power management unit physically coupled to the support frame, wherein the power management unit is electrically coupled to the electrical storage system and the group of thermoelectric modules, and configured to:
control a storage of the electrical energy in the electrical storage system from the electrical current from the group of thermoelectric modules; and
supply the electrical energy to the propulsion system.

2. The vehicle of claim 1, wherein the extendable structure comprises:
an extendable member having a proximal end physically coupled to the power management unit and a distal end that is positionable to one of a heat source and a heat sink.

3. The vehicle of claim 2, wherein the extendable structure further comprises:
a heat concentrator physically coupled to the distal end; and
a malleable heat transfer member physically coupled to the heat concentrator, wherein the malleable heat transfer member has a coefficient of friction sufficient to reduce sliding of the malleable heat transfer member when the malleable heat transfer member is in contact with a surface of one of a heat source and a heat sink.

4. The vehicle of claim 3, wherein the heat concentrator is configured to pivot about the distal end.

5. The vehicle of claim 2, wherein the group of thermoelectric modules is located at the proximal end adjacent to the power management unit and wherein the extendable member is configured to conduct heat in a direction selected from a first direction from the heat source to the group of thermoelectric modules and a second direction from the group of thermoelectric modules to the heat sink.

6. The vehicle of claim 2, wherein the group of thermoelectric modules is located at the distal end and wherein the extendable member is configured to conduct an electrical current from the group of thermoelectric modules to the power management unit.

7. The vehicle of claim 2, wherein the group of thermoelectric modules is located between the distal end and the proximal end of the extendable member, wherein a first portion of the extendable member from the distal end to the group of thermoelectric modules is configured to conduct heat and a second portion of the extendable member from the group of thermoelectric modules to the proximal end is configured to conduct the electrical current generated by the group of thermoelectric modules.

8. The vehicle of claim 2, wherein the power management unit is configured to control a length of the extendable member.

9. The vehicle of claim 1, wherein the group of thermoelectric modules configured to operate with at least one of:
a Seebeck effect, a Peltier effect, or a Thomson effect.

10. The vehicle of claim 1 further comprising:
a payload physically coupled to the support frame and electrically coupled to the electrical storage system, wherein the payload comprises at least one of a wireless transmitter, a wireless receiver, or a sensor.

11. The vehicle of claim 1 further comprising:
a navigation system configured to, responsive to receipt of commands, control the propulsion system to move the vehicle; and
a recharge management system in communication with the navigation system and the group of thermoelectric modules, wherein the recharge management system is configured to: detect a level of the electrical current from the group of thermoelectric modules, detect a rate of use of the electrical energy stored in the electrical storage system, determine a net rate of charge of the electrical storage system using the level of the electrical current detected from the group of thermoelectric modules and the rate of use, compare the net rate of charge with a minimum desired charge rate and a maximum charge rate, and send a command to the navigation system selected from a group that comprises: a seek command when the net rate of charge is below the minimum desired charge rate, a stay command when the net rate of charge equal to or above the minimum desired charge rate, and a positioning command that causes the vehicle to move relative to a heat source to increase the net rate of charge when the net rate of charge is above the minimum desired charge rate and below the maximum charge rate.

12. The vehicle of claim 11, wherein the navigation system includes a thermal sensing unit configured to detect at least one of the heat source or a heat sink.

13. The vehicle of claim 11, wherein the navigation system is configured to control the propulsion system to move the vehicle such that a distal end of the extendible structure moves in a dithering pattern to find one of a hot region or a cold region.

14. The vehicle of claim 1, wherein the extendable structure is selected from a group that comprises: an extendable member, a telescoping member, a telescopic cylinder, and a folding beam.

15. The vehicle of claim 1, wherein the electrical storage system that comprises at least one of: a battery, a lithium ion battery, a capacitor, or an electrical accumulator.

16. The vehicle of claim 1, wherein the vehicle is selected from a group that comprises: a cyclocopter, a micro aerial vehicle, an unmanned aerial vehicle, an unmanned ground vehicle, and an unmanned underwater vehicle.

17. A charging system that comprises:
a group of thermoelectric modules configured to generate an electrical current in response to a temperature differential;
a power management unit that comprises a power output configured to be connected to a user device and to output the electrical current to the user device, wherein the power management unit is electrically coupled to the group of thermoelectric modules; and
an extendable structure physically coupled to the power management unit and the group of thermoelectric modules.

18. The charging system of claim 17, wherein the extendable structure comprises:
an extendable member having a proximal end physically coupled to the power management unit and a distal end that is positionable to one of a heat source and a heat sink such that the temperature differential is present that causes heat to be transferred through the group of thermoelectric modules.

19. The charging system of claim 18, wherein the group of thermoelectric modules is located at the proximal end adjacent to the power management unit and wherein the extendable member is configured to conduct the heat in a direction selected from one of: the heat source to the group of thermoelectric modules, or the group of thermoelectric modules to the heat sink.

20. The charging system of claim 18, wherein the group of thermoelectric modules is located between the distal end and the proximal end of the extendable member, wherein a first portion of the extendable member from the distal end to the group of thermoelectric modules is configured to conduct the heat and a second portion of the extendable member from the group of thermoelectric modules to the proximal end is configured to conduct the electrical current generated by the group of thermoelectric modules.

21. The charging system of claim 18, wherein the group of thermoelectric modules is located at the distal end and wherein the extendable member is configured to conduct the electrical current from the group of thermoelectric modules to the power management unit.

22. The charging system of claim 18, wherein the extendable member is a first extendable member, the group of thermoelectric modules is a first group of thermoelectric modules and the extendable structure further comprises:
a second group of thermoelectric modules; and
a second extendable member physically coupled to the power management unit and to the second group of thermoelectric modules.

23. The charging system of claim 17, wherein the user device is selected from a group that comprises a light, a mobile phone, and a radio.

24. An unmanned aerial vehicle comprising:
a support frame;
a propulsion system coupled to the support frame, wherein the propulsion system is powered by an electrical energy;
a telescoping member having a proximal end and a distal end;
a heat concentrator physically coupled to the distal end;
a malleable heat transfer member physically coupled to the heat concentrator;
a group of thermoelectric modules physically coupled to the telescoping member, wherein the group of thermoelectric modules generates an electrical current when a heat is transferred through the group of thermoelectric modules in response to the malleable heat transfer member being in proximity of a heat source and a heat sink such that the heat is transferred through the group of thermoelectric modules;
an electrical storage system physically coupled to the support frame and configured to supply the electric energy to operate the propulsion system; and
a power management unit physically coupled to the support frame, wherein the power management unit is electrically coupled to the electrical storage system and to the group of thermoelectric modules, and is configured to:
control storage of the electrical current from the group of thermoelectric modules as the electrical energy in the electrical storage system; and
supply the electrical energy to the propulsion system.

25. A method for charging a vehicle that comprises:
a support frame;
a propulsion system physically coupled to the support frame and configured to operate using an electrical energy;
an electrical storage system physically coupled to the support frame and configured to supply the electrical energy to the propulsion system, an extendable structure;

a group of thermoelectric modules physically coupled to the extendable structure; and a power management unit physically coupled to the support frame, wherein the power management unit is electrically coupled to the electrical storage system and the group of thermoelectric modules, and controls storing the electrical energy in the electrical storage system, such that the method comprises:

extending a distal end of an extendable member towards one of a heat source and a heat sink such that a temperature differential is present that causes a heat to be transferred through the group of thermoelectric modules physically coupled to the extendable member, wherein a proximal end of the extendable member is physically coupled to a support frame for the vehicle;

generating an electrical current from the group of thermoelectric modules in response to the heat being transferred through the group of thermoelectric modules in which the heat being transferred through the group of thermoelectric modules is caused by a temperature differential; and storing the electrical energy in the electrical storage system using the electrical current generated by the group of thermoelectric modules, wherein the electrical storage system is physically coupled to the support frame and supplies the electrical energy to operate the vehicle.

26. The method of claim 25, wherein a heat concentrator is physically coupled to the distal end and a malleable heat transfer member is physically coupled to the heat concentrator and wherein extending the extendable member comprises:

extending the extendable member such that the malleable heat transfer member contacts one of the heat source and the heat sink such that the temperature differential is present that causes the heat to be transferred through the group of thermoelectric modules.

27. The method of claim 26, wherein the vehicle is an unmanned aerial vehicle and wherein the malleable heat transfer member contacting one of the heat source and the heat sink reduces an amount of lift needed by the unmanned aerial vehicle such that a use of electrical energy from the electrical storage system is reduced.

28. The method of claim 25, wherein the extendable member is selected from a group comprising a telescoping member, a telescopic cylinder, and a folding beam.

29. The method of claim 25, wherein the electrical storage system comprises at least one of: a battery, a lithium ion battery, a capacitor, or an electrical accumulator.

* * * * *